United States Patent [19]

Abe

[11] Patent Number: 5,420,390

[45] Date of Patent: May 30, 1995

[54] IMAGE HEATING APPARATUS USING A MICROWAVE DISCHARGE PLASMA LAMP

[75] Inventor: Toshio Abe, Kanagawa, Japan

[73] Assignee: Mitsubishi Denki Kabushiki Kaisha, Tokyo, Japan

[21] Appl. No.: 701,615

[22] Filed: May 14, 1991

Related U.S. Application Data

[63] Continuation-in-part of Ser. No. 642,210, Jan. 16, 1991, abandoned.

[30] Foreign Application Priority Data

| Jan. 19, 1990 | [JP] | Japan | 2-3653 U |
| Apr. 19, 1990 | [JP] | Japan | 2-41903 U |
| Aug. 8, 1990 | [JP] | Japan | 2-210032 |
| Nov. 30, 1990 | [JP] | Japan | 2-335279 |

[51] Int. Cl.⁶ .............................................. B23K 10/00
[52] U.S. Cl. ........................... 219/121.36; 219/121.59; 219/121.48; 219/121.52; 219/121.56; 313/231.61; 313/231.71
[58] Field of Search ............... 219/121.36, 131.48, 219/121.52, 121.54, 121.56, 121.59; 313/231.61, 231.71, 231.31

[56] References Cited

U.S. PATENT DOCUMENTS

| 3,418,507 | 12/1966 | Young | 313/231.71 |
| 4,634,492 | 1/1987 | Oguri et al. | 156/605 |
| 4,866,351 | 9/1989 | Yazaki | 313/231.61 |
| 4,901,935 | 2/1990 | Wood | 313/231.61 |

FOREIGN PATENT DOCUMENTS

| 0797365 | 10/1968 | Canada | 313/231.71 |
| 0153745 | 2/1985 | European Pat. Off. |
| 0228517 | 10/1986 | European Pat. Off. |
| 3214110 | 4/1982 | Germany. |
| 0636769 | 1/1988 | Japan. |
| 3223487 | 9/1988 | Japan. |
| 2180784 | 12/1988 | Japan. |
| 0150837 | 10/1989 | Japan. |
| 0268486 | 7/1990 | Japan. |

Primary Examiner—Mark H. Paschall
Attorney, Agent, or Firm—Wolf, Greenfield & Sacks

[57] ABSTRACT

An improved image heating apparatus using a plasma lamp is disclosed. The apparatus comprises at least one rotary elliptical mirror having a reflection surface of a rotary elliptical body at the inside; a plasma lamp disposed at a first focal point of the rotary elliptical mirror; a member for supporting the plasma lamp; an electric wave shielding member provided inside the rotary elliptical mirror; a cavity resonator defined by the rotary elliptical mirror and the electric wave shielding member, and adapted to accommodate the plasma lamp; a high frequency oscillator adapted to supply electromagnetic wave to the cavity resonator via a wave guide; and a test sample disposed at a second focal point of the rotary elliptical mirror.

66 Claims, 23 Drawing Sheets

IMAGE HEATING APPARATUS USING A MICROWAVE DISCHARGE PLASMA LAMP

This application is a continuation-in-part of Ser. No. 642,210 filed Jan. 16, 1991, now abandoned.

BACKGROUND OF THE INVENTION:

1. Field of the Invention

The present invention relates to an improvement of an image heating apparatus for an image furnace which is employed for crystal growth of, for example, a semiconductor material.

2. Description of the Prior Art

FIG. 1 is the sectional view illustrating an image heating apparatus of a prior art as disclosed, for example, in "Solid State Physics" vol. 14, No. 10, 1979, pp 633–640. In FIG. 1, numeral 1 designates a rotary elliptical mirror having a reflective surface of a rotary elliptical body at the inside, numeral 11 a light source comprising such lamps as halogen lamp, xenon lamp or the like disposed at the first focal point of the rotary elliptical mirror 1 and adapted to emit the light 9, numeral 12 a power source connected to the light source 11 via a wiring 18 for supplying the electric power, and numeral 8 a test sample positioned at the second focal point of the rotary elliptical mirror 1.

Since the image heating apparatus according to a prior art was constituted as described above, the light emitted from the light source was reflected by the rotary elliptical mirror 1 and condensed on the surface of the test sample 8. Accordingly, the temperature of the test sample 8 can be raised and the test sample may be melted to produce crystal.

However, since a halogen lamp or a xenon lamp is used for the light source, the emitting range of the light source is as small as 5 mm. As a consequence, a small image is focused at the surface of the test sample 8. This causes an acute temperature gradient, such that cracks might be developed in the test sample 8. It is therefore necessary, in the case of the image heating apparatus of a prior art, to adjust the heating area of a test sample depending on the requirement. This adjustment is made in such a way as to displace a part of the rotary elliptical mirror so as to blur the focus or prepare an after heater to complement the blur the focus or prepare an after heater to complement the heating. Provision of an additional mechanism as above will considerably degrade the operational efficiency of a furnace and make the constitution of the apparatus more complicated, impairing the function of the furnace. Thus, a serious problem ensued.

Furthermore, when such lamps as halogen lamp, xenon lamp or the like having electrodes are employed as the light source, their relatively short life [for example, in the order of about 40 hours (in the case of application for space technology)] inevitably required a large number of spare halogen lamps to be stocked. In case of halogen lamps or xenon lamps, since it was not possible to directly melt the glass by its light, and the glass was placed in a mesh of platinum material and subjected to image heating, the platinum material intruded into the glass when it was melted, thus degrading the quality. This caused a big disturbance, particularly in the course of processing such materials as infrared fiber or the like.

Furthermore, since only a narrow range is heated by the light source of a prior art, uniform heating in the circumferential direction of a test sample is not possible. For this reason, the test sample has to be rotated at a speed as high as 100 r.p.m. cause uniform distribution of temperature.

However, if the test sample is rotated at such a high speed, uniform crystal growth may be disturbed. Particularly in the case of a microgravity experiment, since artificial gravity is created and air bubbles are enclosed in the crystal by the centrifugal force and can never come out, which is a serious problem. This problem has not yet been solved worldwide. Therefore, for the image furnace to be used in a space shuttle experiment, the test sample is rotated at a high speed so as to attain a uniform heating. In this respect, it is apprehended that the microgravity effect may not be adequately performed.

SUMMARY OF THE INVENTION

The present invention has been proposed to solve the problems as described above.

Accordingly, an object of the present invention is to provide an image heating apparatus using a microwave discharge plasma lamp.

Another object of the present invention is to provide an image heating apparatus of microwave discharge type using single elliptical ball resonance which uses a microwave discharge plasma lamp as the light source and condenses the light by a single rotary elliptical mirror to heat a test sample.

A further object of the present invention is to provide an image heating apparatus which encloses an electric wave shielding ball to fill gas therein, thereby enhancing heat radiation from the microwave discharge lamp and eliminating necessity of cooling.

A further object of the present invention is to provide an image heating apparatus which uses a cylindrical type microwave discharge lamp as the light source and rotates the lamp to dispose it in parallel with the test sample when it is necessary to expand the heating area and also dispose it so as to be normal to the test sample when it is necessary to reduce the heating area.

A further object of the present invention is to provide an image heating apparatus which uses a disc type plasma lamp as the light source, said disc type plasma lamp having a translucent vessel made of quartz or the like with an element filled therein, heating the element by microwave (having the frequency band equivalent to that of a microwave oven in the vicinity of 2.4 GHz) to generate plasma in the vessel and utilizing the light emission by the plasma, and rotates the disc type plasma lamp to dispose it in parallel with a test sample when it is necessary to expand the heating area and also dispose it to be normal to the test sample when it is necessary to reduce the heating area.

According to the present invention, since the shape of the light source is spherical, distribution of the light condensed by a single rotary elliptical mirror is made uniformly spherical at the second focal point, so that the temperature gradient may be more gradual, thus making it possible to prevent cracks.

According to the present invention, since the light emission from the microwave discharge plasma lamp is in the spherical configuration, the temperature gradient at the test sample 8 may be made gradual, preventing development of cracks 7 and also since the light emission spectrum is concentrated at the near infrared zone, the heating efficiency may be enhanced.

Furthermore, according to the present invention, since the cavity resonator is made in a cup-like configuration, it is not affected by the configuration and size of the rotary elliptical mirror, so that an identical microwave discharge lamp may be adapted to various rotary elliptical mirrors.

Still further, according to the present invention, since inert gas having good thermal conductivity is filled in the electric wave shielding ball, heat can be radiated from the microwave discharge lamp through heat transfer from the inert gas.

Since the light is condensed by a single rotary elliptical mirror, the entire apparatus may be advantageously lighter and miniaturized.

Furthermore, since the cavity resonator can be connected to a wave guide by way of a base, the microwave discharge lamp can be readily exchanged with a replacement.

Furthermore, the pattern of light emission and the light emission spectrum by the microwave discharge lamp may be changed depending on particular test samples and treatment of the test sample may be effectively executed. For example, if the light emission spectrum of the microwave discharge lamp is set at the ultraviolet zone, the image heating for glass which has hithertofore been impossible may be made possible. Thus, an epoch-making effect in manufacture of pure glass for use in space technology, in particular, may be provided. Furthermore, according to the present invention, since gas is filled in the enclosed cavity resonator so as to improve thermal conductivity, the cooling air for the microwave discharge lamp may be dispensed with, so that constitution of the relevant apparatus may be considerably simplified. This aspect is particularly advantageous in experiments in space where weight limitation is very critical.

According to the cylindrical type microwave discharge lamp based on the present invention, since the pattern of the light source is cylindrical, so that distribution of the light at the second focal point may be made cylindrical, the temperature gradient may be gradual or acute by rotating the lamp.

According to the present invention, since the pattern of light emission from the cylindrical type microwave discharge lamp is cylindrical, the temperature gradient of the test sample 8 may be set to be acute or gradual, so that the heating zone suitable for the relevant crystal growth may be selected. Furthermore, since the light emission spectrum can be widely selected from the ultraviolet zone to the infrared zone, a wide range of test samples may be heated. In particular, since glass may be melted by image heating, the present invention is particularly effective in production of pure glass for space application which exceedingly enhances the efficiency of fiber cable.

By rotating the cylindrical type microwave discharge lamp to change its orientation, the temperature gradient at the test sample may be made acute or gradual.

According to the present invention, since the pattern of the light source is of a disc-like configuration and distribution of the light at the second focal point can accordingly be made of a disc-like configuration, uniform heating may be provided along the entire periphery of the test sample, thus eliminating the necessity of rotating the test sample at a high rotational speed. Furthermore, if the lamp is rotated by 90 degrees, the test sample can be heated in a wide range. Still further, since the light emission wavelength of the lamp can be set at the zones from the ultraviolet to the infrared zones, the image heating is made possible in the adsorption band of glass material.

Further, according to the present invention, since the pattern of light emission by the disc type plasma lamp is in a disc-like configuration, the temperature gradient at the test sample can be made acute or gradual by rotating the disc type plasma lamp. Accordingly, the heating zone suitable for crystal growth may be selected, so that a high quality, devoid of cracks in the crystal, may be attained.

Further, since the light emission spectrum can be selected from the ultraviolet zone to the infrared zone, a wide range of test samples can be heated. Particularly, since glass may be melted by image heating, pure infrared glass which exceedingly enhances the efficiency of fiber cable may be advantageously produced in space as well as on the earth.

Still further, since the test sample may be uniformly heated, it is not so necessary to rotate the test sample for uniform heat distribution. And since crystal growth is possible at a low rotational speed, it is possible to remove bubbles in the crystal especially at the microgravity. More specifically, the bubbles may be moved outwardly by convection due to the temperature gradient.

Furthermore, since electrodeless discharge is utilized, the life time of the lamp can be considerably extended or it can be extended more than 10,000 hours, which means that the present invention can provide the furnace having a life time 100 times more than that of a prior art.

Furthermore, since the lamp is compact and light, requiring a smaller place for storage, this aspect is very important if it is used in space.

Furthermore, since the emission wavelength of the lamp can be selected from a range that is between the ultraviolet zone and the infrared zone, image heating can be effected within an absorption band of a laser glass or the like. It is possible, therefore, to form an interface of a solid solution layer into a recess shape and hence to enlarge the formed crystal in size (because the center portion of the crystal is subject to a higher temperature while the side portion thereof is subject to a lower temperature).

DETAILED DESCRIPTION OF THE PREFERRED EMBODIMENTS:

The image heating apparatus using a single elliptical ball microwave discharge according to an embodiment of the present invention will now be explained by referring to the accompanying drawings.

Figure 1:
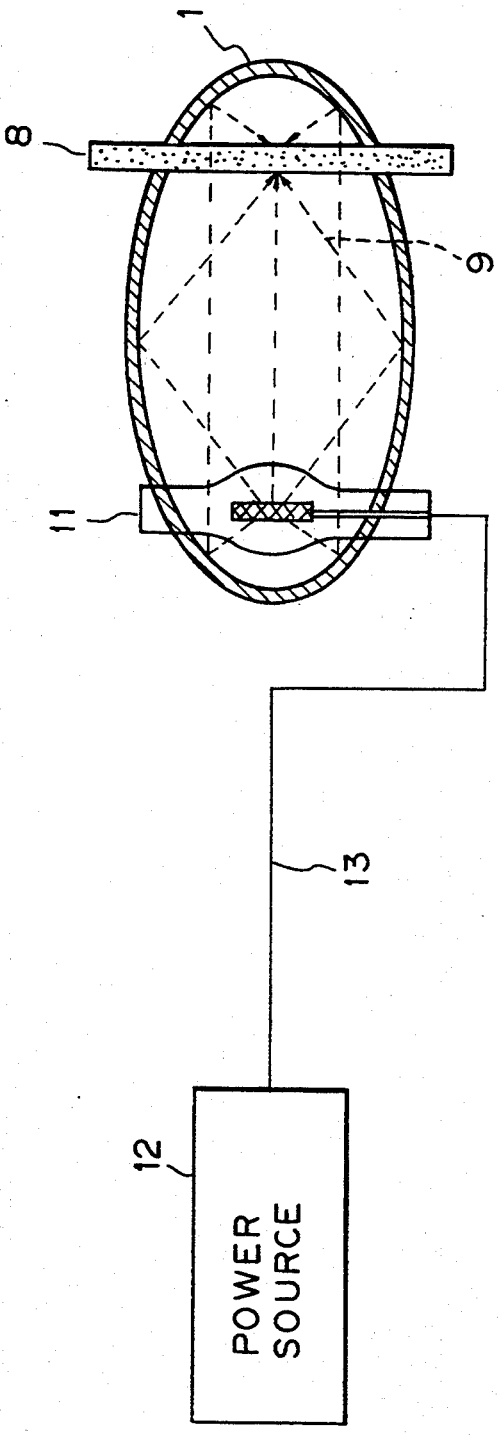
FIG. 1 schematically illustrates the constitution of the image heating apparatus according to a prior art.
Figure 2:
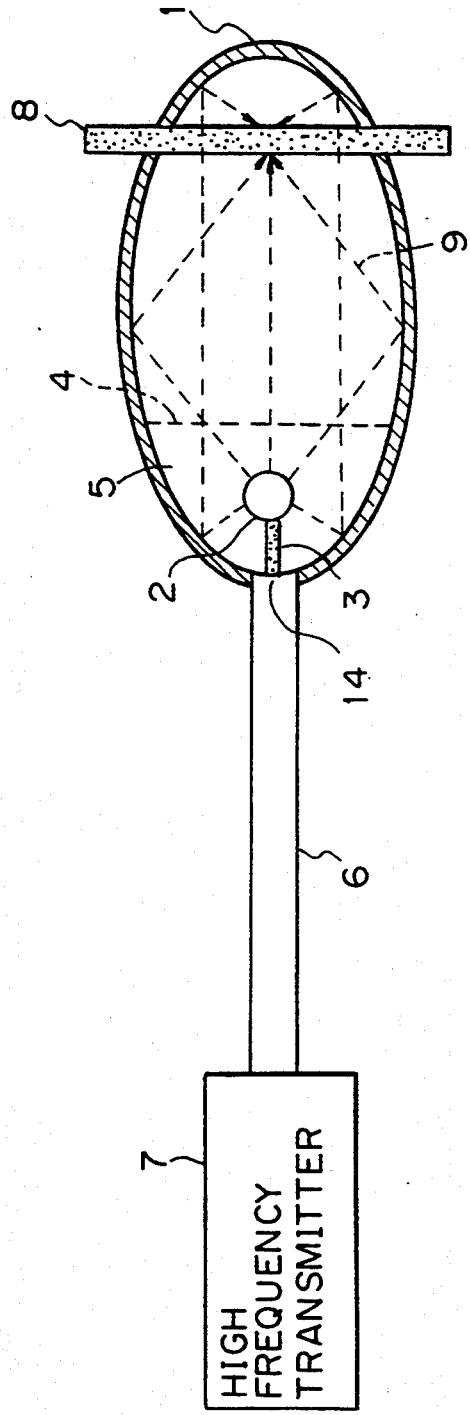
FIGS. 2 and 3 schematically illustrate the constitution of the image heating apparatus using a single elliptical ball microwave discharge according to the first embodiment of the present invention.
Figure 3:
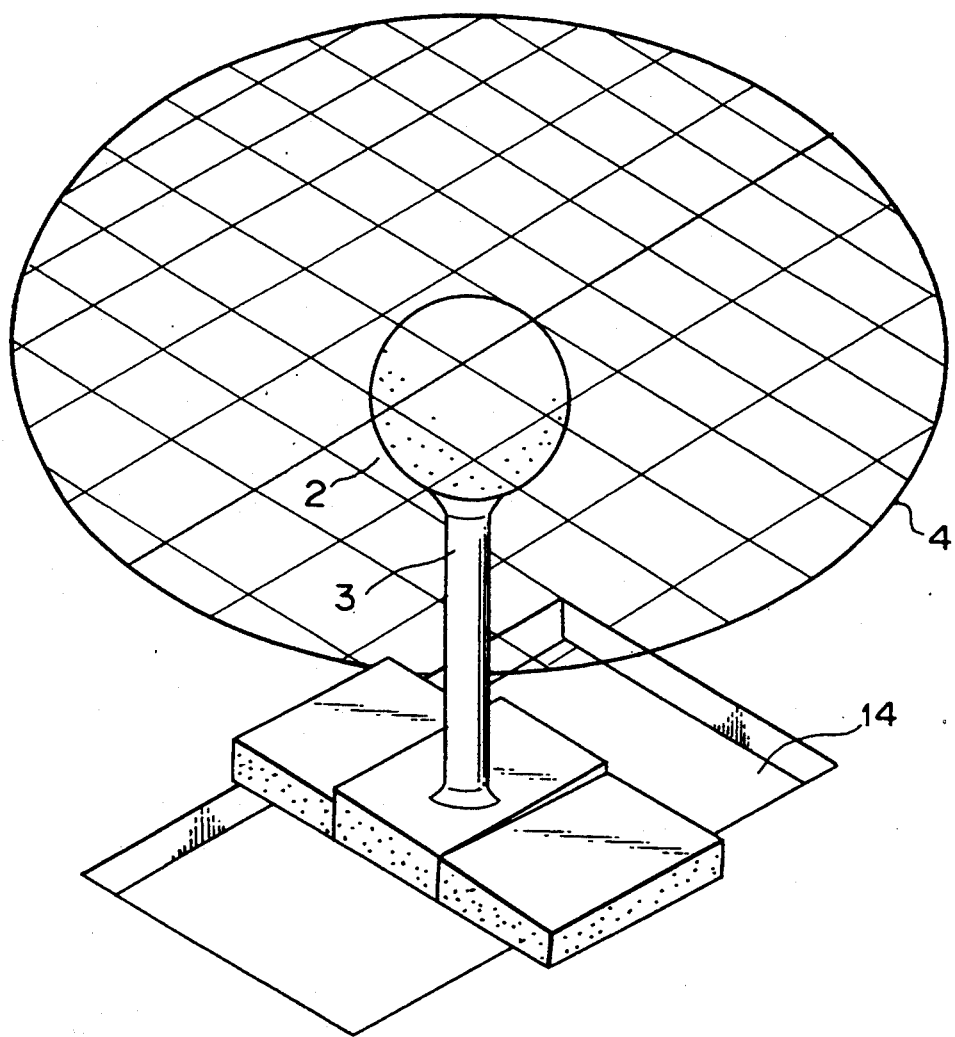

FIGS. 2 and 3 illustrate the constitution of the image heating apparatus using a single elliptical ball microwave discharge according to the first embodiment of the present invention. Numeral 1 designates a rotary elliptical mirror. Numeral 2 designates a microwave discharge plasma lamp which encloses such an element as potassium or the like inside a hollow ball made of glass or translucent ceramic material and generates plasma by heating the element by microwave to emit a light 9. Numeral 3 designates a support tool made of bar-like ceramic material having a high thermal conductivity. Numeral 4 designates an electric wave shielding plate of a disc-like configuration having the peripheral edge attached to the rotary elliptical mirror 1 in contact with the inner periphery of the mirror. Numeral 5 designates a cavity resonator defined by the end portion of the rotary elliptical mirror 1 and the electric wave shielding plate 4. Numeral 6 designates a wave guide attached to the bore provided at the end portion of the rotary elliptical mirror 1. Numeral 7 designates a high frequency transmitter attached to the other end of the wave guide 6, numeral 8 a bar-like test sample disposed at the second focal point of the rotary elliptical mirror 1 and numeral 14 a window opened at the contact point between the wave guide 6 and the rotary elliptical mirror 1.

In FIG. 2, microwave power having such a high frequency as 2 GHz and a few KW is applied from the high frequency transmitter 7 to the cavity resonator S via the wave guide 6. Microwave discharge plasma lamp 2 incorporated in the cavity resonator 5 is adapted to generate intense light by generating plasma. This light is reflected at the inner surface of the rotary elliptical mirror 1 and condensed on the test sample at the second focal point. This causes the test sample 8 to be melted due to a hot heat.

When the test sample 8 is pulled upwardly while it is rotated, then crystal growth will proceed.

Since the light emission spectrum of the microwave discharge plasma lamp 2 is concentrated at the near infrared zone which represents the wavelength having the light absorptivity of the test sample, a very high heating efficiency may be attained compared to xenon lamp or the like.

Figure 4:
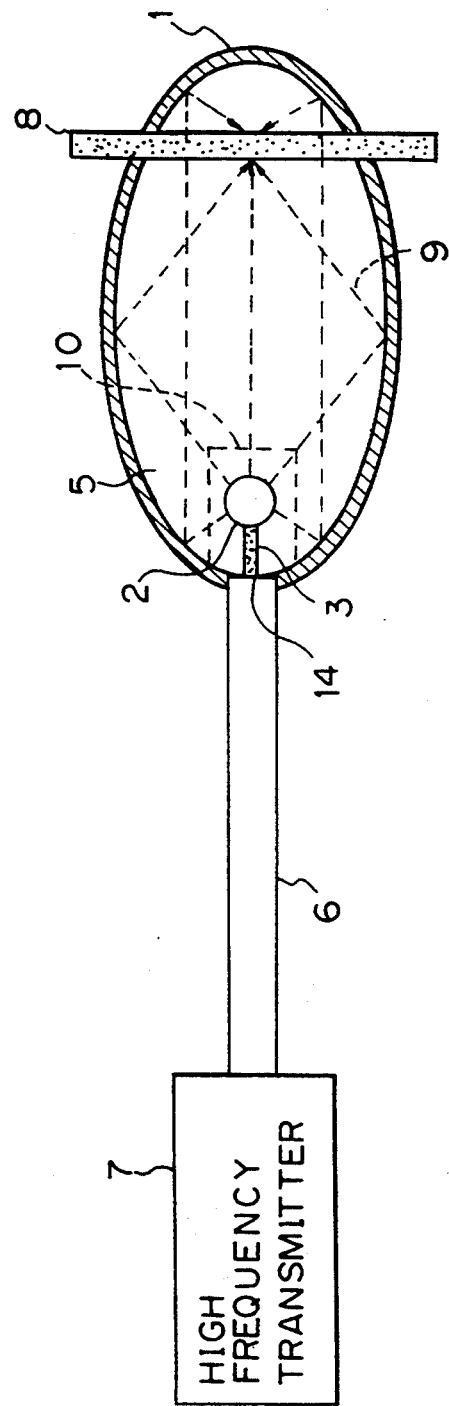
FIGS. 4 and 5 schematically illustrate the constitution of the image heating apparatus using a single elliptical ball microwave discharge according to the second embodiment of the present invention.
Figure 5:
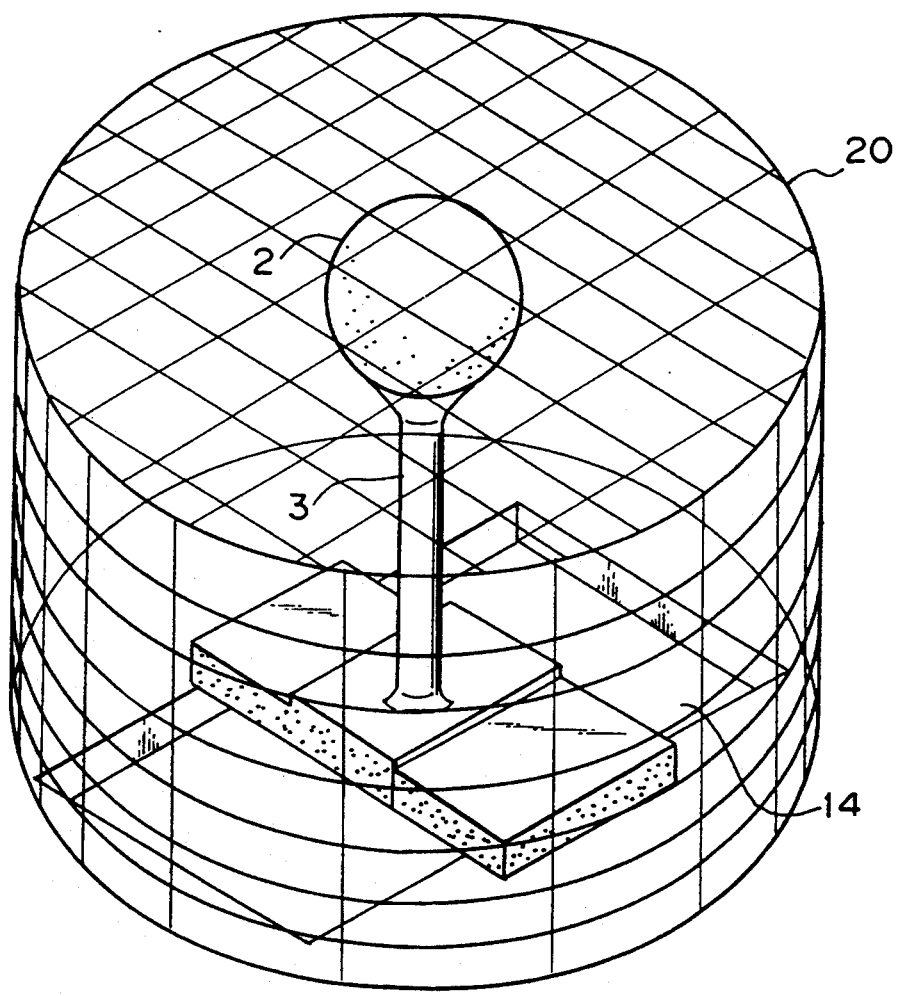

The second embodiment of the present invention is shown in FIGS. 4 and 5. In the drawings, numeral 20 designates the electric wave shielding plate of a cup-like configuration which defines a cavity resonator 5 with the peripheral edge portion at the open side of the electric wave shielding plate of a cup-like configuration being in contact with the first focal point of the rotary elliptical mirror 1. According to this embodiment, a microwave discharge lamp 2 is arranged in the cavity resonator 5 of a cup-like configuration so as to emit light.

Figure 6:
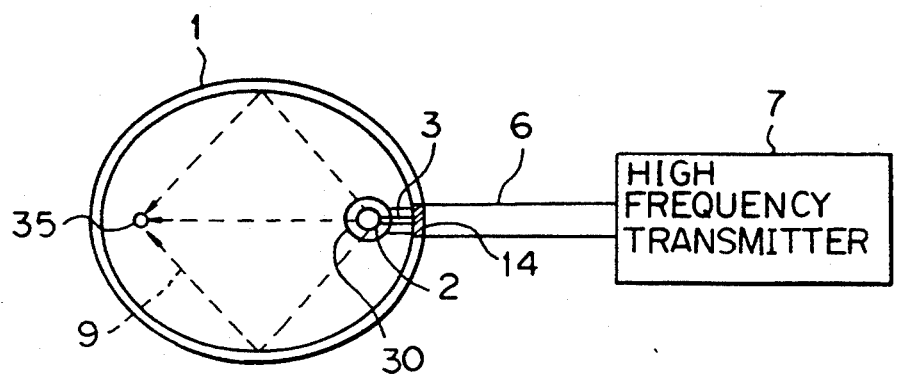
FIGS. 6, 7 and 8 schematically illustrate the constitution of the image heating apparatus using a single elliptical ball microwave discharge according to the third embodiment of the present invention.
Figure 7:
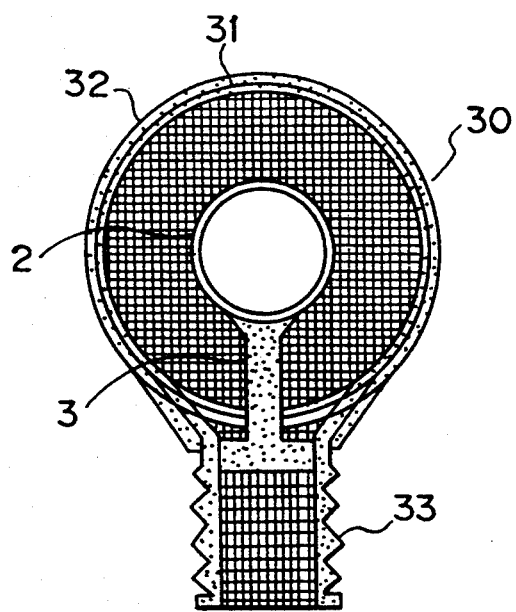

FIGS. 6 and 7 illustrate the constitution of the image heating apparatus using a single elliptical ball resonance microwave discharge according to the third embodiment of the present invention. In the drawings, numeral 1 designates a rotary elliptical mirror having a rotary elliptical mirror surface at the inner face. Numeral 2 designates a microwave discharge plasma lamp which encloses such an element as potassium or the like inside a hollow ball made of glass or translucent ceramic material, and which generates plasma by heating the element by microwave and emit light 9 of the near infrared zone (the wavelength in the vicinity of 0.76 microns having the highest heating efficiency). Numeral 3 designates a support tool made of a bar-like ceramic material having a high thermal conductivity. Numeral 30 designates a cavity resonator having an electric wave shielding ball 81 of spherical configuration (FIG. 7) encased by a glass ball 32 and a base 33 attached to one end of the electric wave shielding ball 31 made of mesh. Numeral 6 designates a wave guide connected to the base 33 by way of a fitting portion 34. It is to be noted that although a spherical wave guide is used in this embodiment, a rectangular wave guide may be used as well. Numeral 7 designates a high frequency generator attached to the other end of the wave guide 6 and magnetron or the like is used for this purpose. Numeral 35 designates a test sample disposed at the second focal point of a single rotary elliptical mirror 1.

Figure 8:
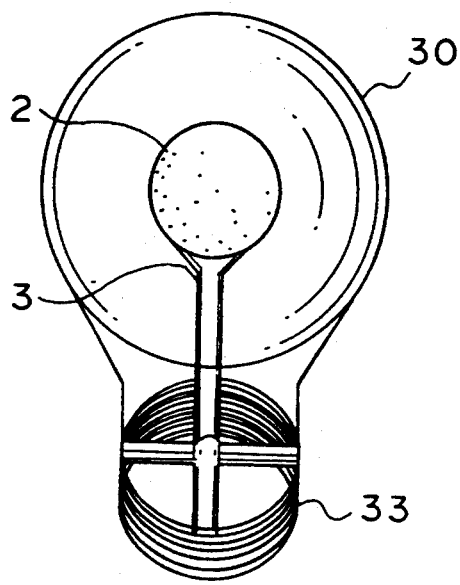

FIG. 8 illustrates the constitution of a microwave discharge lamp 2.

In FIG. 8, microwave power having a high frequency such as 2 GHz or the like and a few KW is applied from the high frequency generator 7 to the cavity resonator 30 by way of the fitting portion 34 of the wave guide 6. The microwave discharge plasma lamp 2 incorporated in the cavity resonator 30 generates plasma and thus emits intense light (the intensity of the light is a few times stronger than the conventional xenon lamp or halogen lamp for the same input). This light is reflected at the inner surface of a single rotary elliptical mirror 1 and condensed at the test sample at the second focal point. The test sample 35 is here melted by hot heat.

When the test sample is gradually pulled vertically relative to the plane of the drawing while it is rotated, crystal growth will proceed.

Since the emission spectrum of the microwave discharge plasma lamp 2 is concentrated at the near infrared zone having the wavelength providing the highest absorptivity of the test sample 35, a very high heating efficiency may be attained compared to that of a xenon lamp or the like.

Figure 9:
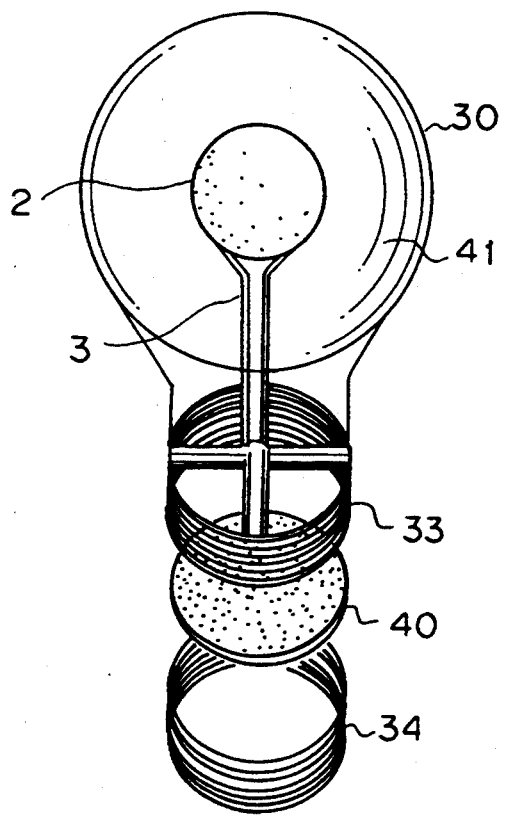
FIGS. 9 and 10 schematically illustrate the constitution of the image heating apparatus using a single elliptically ball microwave discharge and in particular the constitution of the cavity resonator incorporating a microwave discharge plasma lamp according to the fourth embodiment of the present invention.
Figure 10:
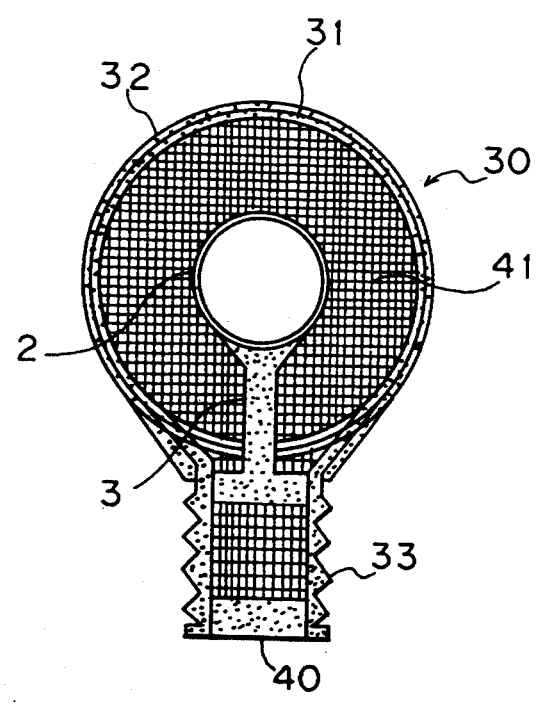

The fourth embodiment of the present invention is illustrated in FIGS. 9 and 10. In these drawings, numeral 40 designates the enclosure plate which seals the interior of the cavity resonator 30 adjacent the base 33 and is formed of a sheet of ceramic material having electric wave translucency. Numeral 41 designates such an inert gas as helium or the like filled in the cavity resonator 30.

According to this embodiment, the heat generated by the microwave discharge lamp 2 may be dissipated from the electric wave shielding ball 31 of the cavity resonator 30 through the gas.

Figure 11:
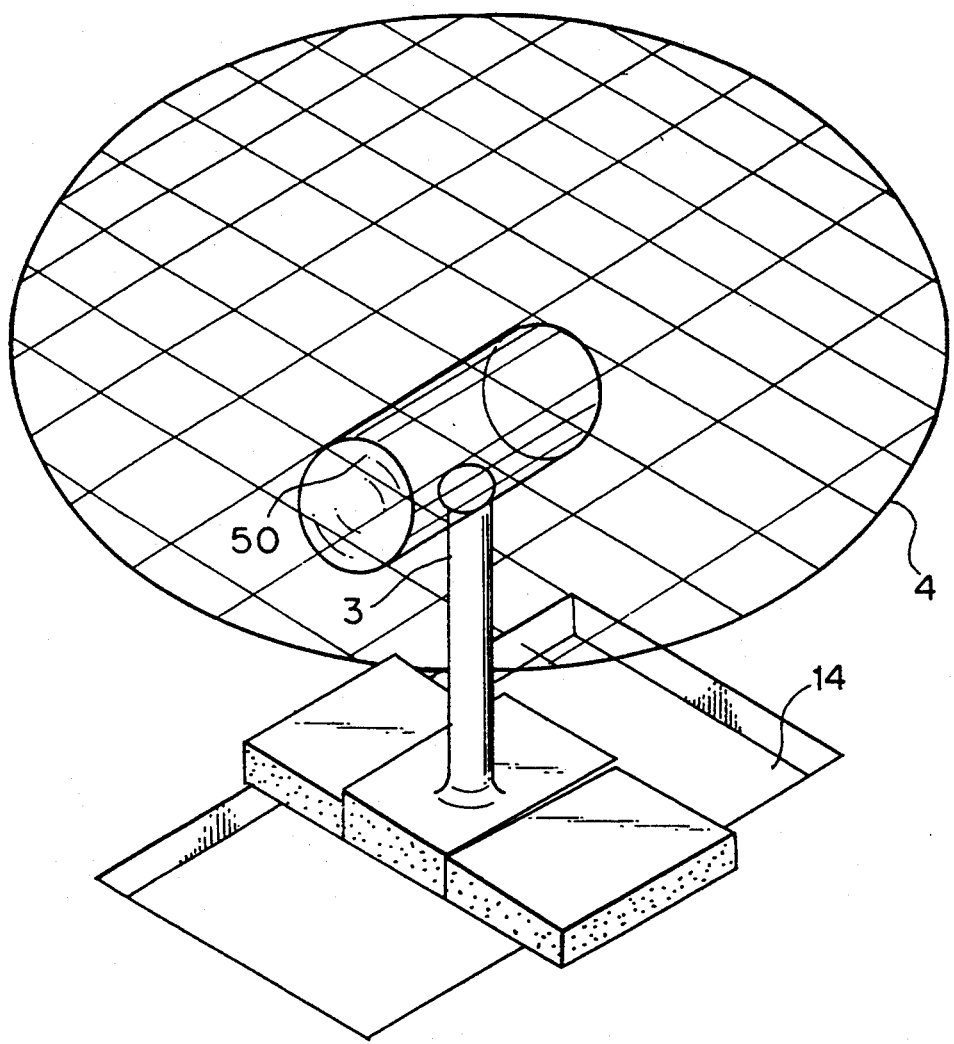
FIG. 11 schematically illustrates the constitution of the image heating apparatus using a single elliptical ball microwave discharge and in particular the constitution of a cylindrical type microwave discharge plasma lamp according to the fifth embodiment of the present invention.

FIG. 11 illustrates the image heating apparatus using a single elliptical ball microwave discharge according to the fifth embodiment of the present invention and in particular the constitution of a microwave discharge plasma lamp. It is clear when compared to the embodiment shown in FIGS. 3 and 5 that numeral 50 is a cylindrical type microwave discharge lamp which encloses such an element as potassium or the like in the hollow cylindrical container made of glass or translucent ceramic material, generates plasma by heating the element with microwave and emits the light 9.

Figure 12:
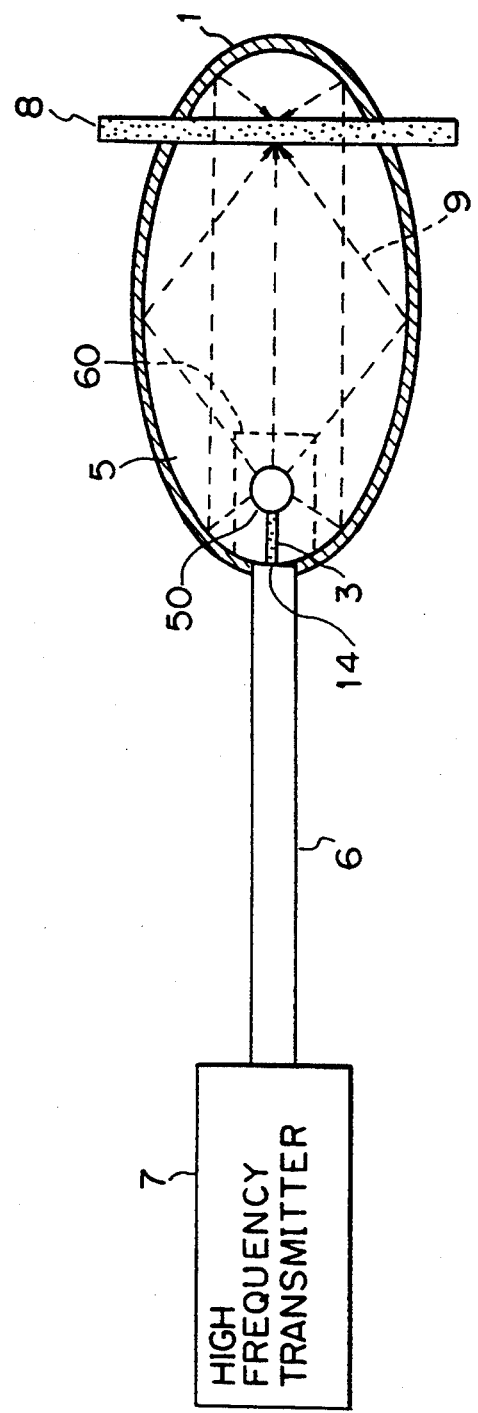
FIGS. 12 and 13 schematically illustrate the constitution of the image heating apparatus using a single elliptical ball according to the sixth embodiment of the present invention.
Figure 13:
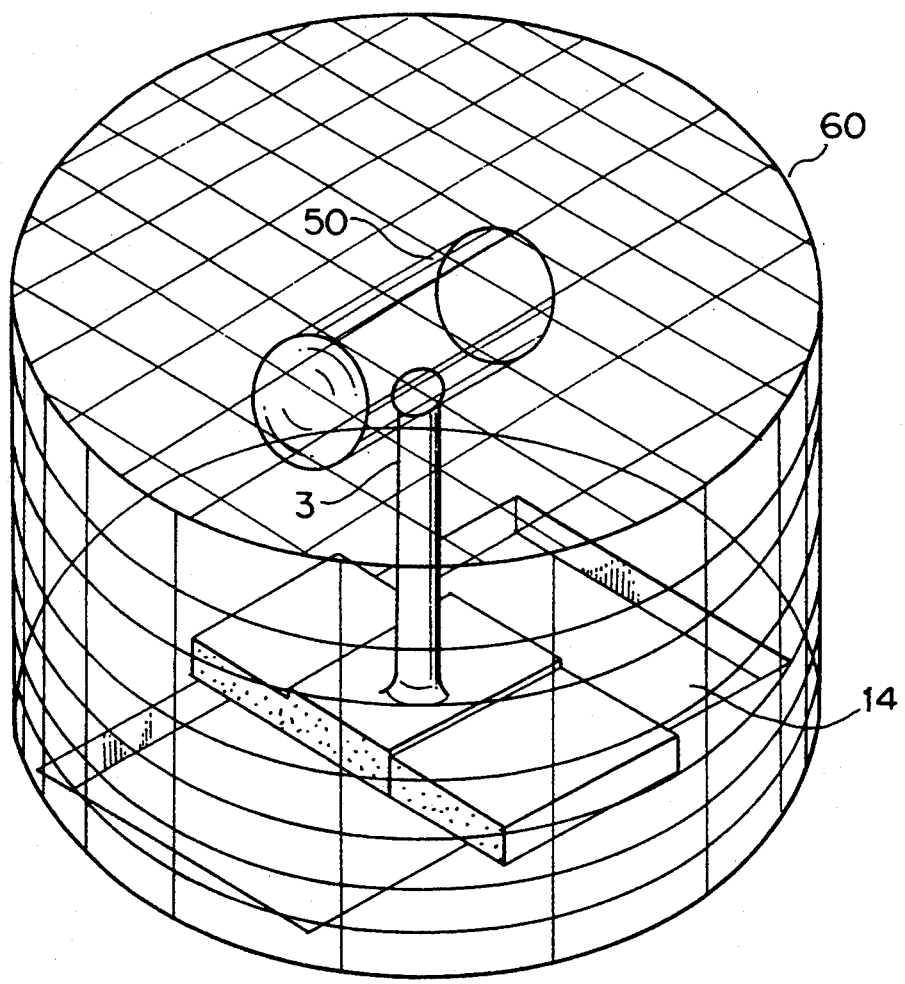

The sixth embodiment of the present invention is illustrated in FIGS. 12 and 13. In these drawings, numeral 60 designates an electric wave shielding plate of a cup-like configuration which defines the cavity resonator 5 with the peripheral edge at the open side of the electric wave shielding plate of a cup-like configuration being in contact with the rotary elliptical mirror 1 at the side of the first focal point and disposes the microwave discharge lamp 50 inside the cavity resonator to emit light.

Since the emission spectrum of the cylindrical type microwave discharge lamp 50 is concentrated at the near infrared zone or the ultraviolet zone which provides the wavelength having the highest absorptivity of the test sample 8, heating can be executed by use of wavelength having combined optical characteristics of glass, metal, semiconductor and the like (in other words, various sorts of microwave discharge lamps are provided with different elements such as ultraviolet light being provided by mercury, near infrared light by potassium and so fourth).

Figure 14:
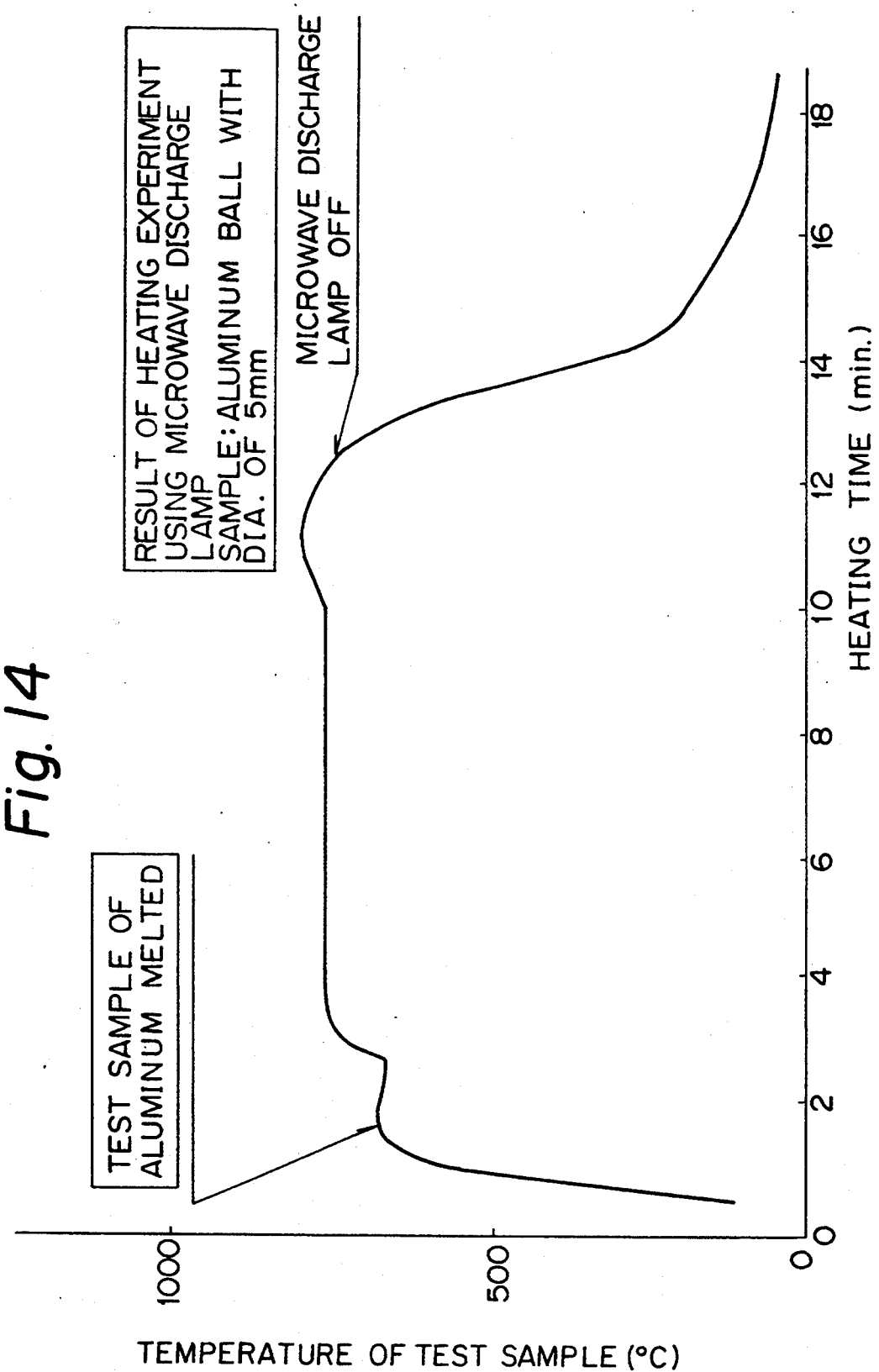
FIG. 14 is a characteristic curve between the heating temperature and the temperature of the test sample illustrating the result of heating experiment of the sixth embodiment of the present invention.

FIG. 14 illustrates the result of heating test of a test sample (in this instance, an aluminum ball) using a microwave discharge lamp by means of a single elliptical image heating apparatus. The abscissa indicates the time and the ordinate indicates the temperature. The microwave discharge lamp which has been employed in the abovementioned test is capable of emitting near infrared light having the wavelength of 0.76 microns. As is clear from the diagram in FIG. 14, the temperature of the aluminum ball as the test sample has reached 660° C. in about 2 minutes and then melted.

The input power of the microwave discharge lamp at this instance is approximately 300 W. The result of this test has ascertained that the heating capability of the microwave discharge lamp is equivalent to that of a conventional halogen lamp.

Figure 15:
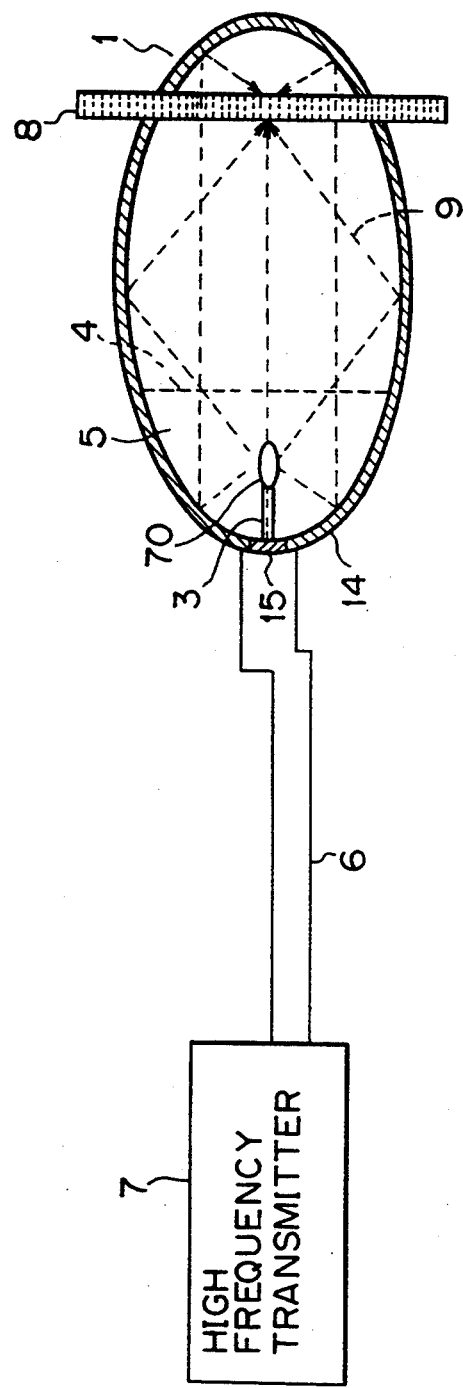
FIGS. 15 and 16 schematically illustrate the constitution of the image heating apparatus using a single elliptical ball microwave discharge particularly utilizing a disc type plasma lamp according to the seventh embodiment of the present invention.
Figure 16:
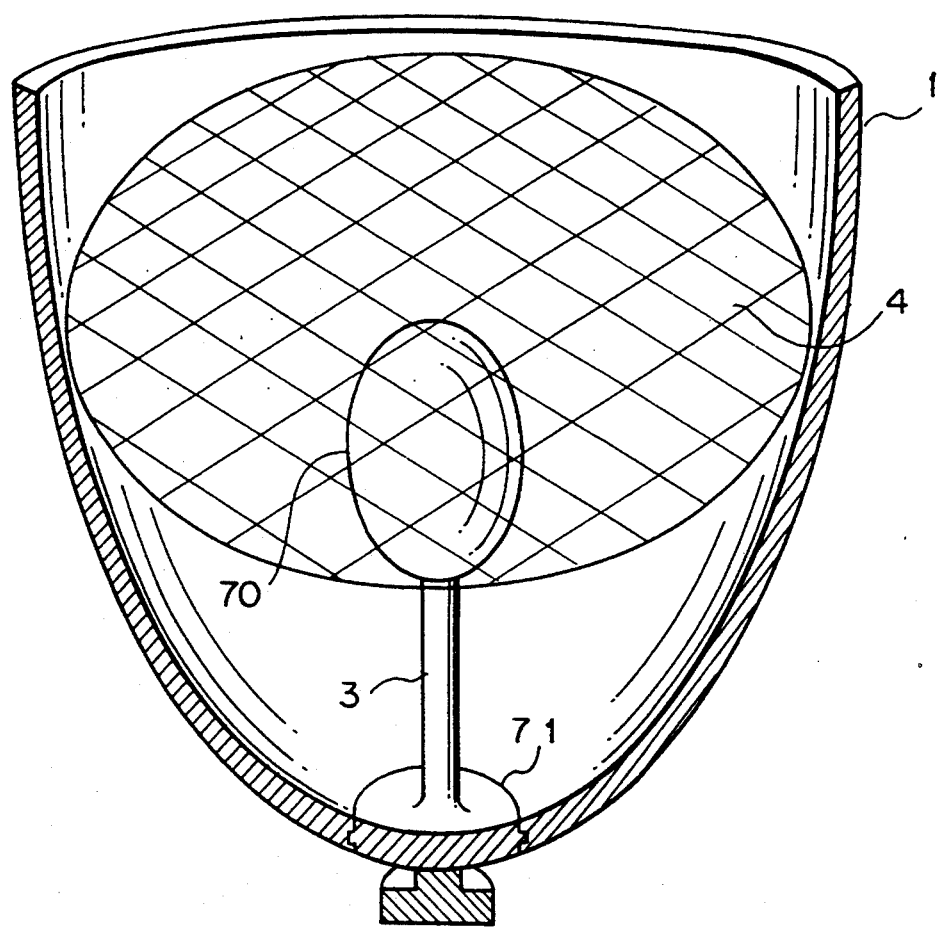

FIGS. 15 and 16 illustrate the seventh embodiment of the present invention. It is to be noted that those components which are the same as those in other embodiments are denoted with same numerals.

Figure 17:
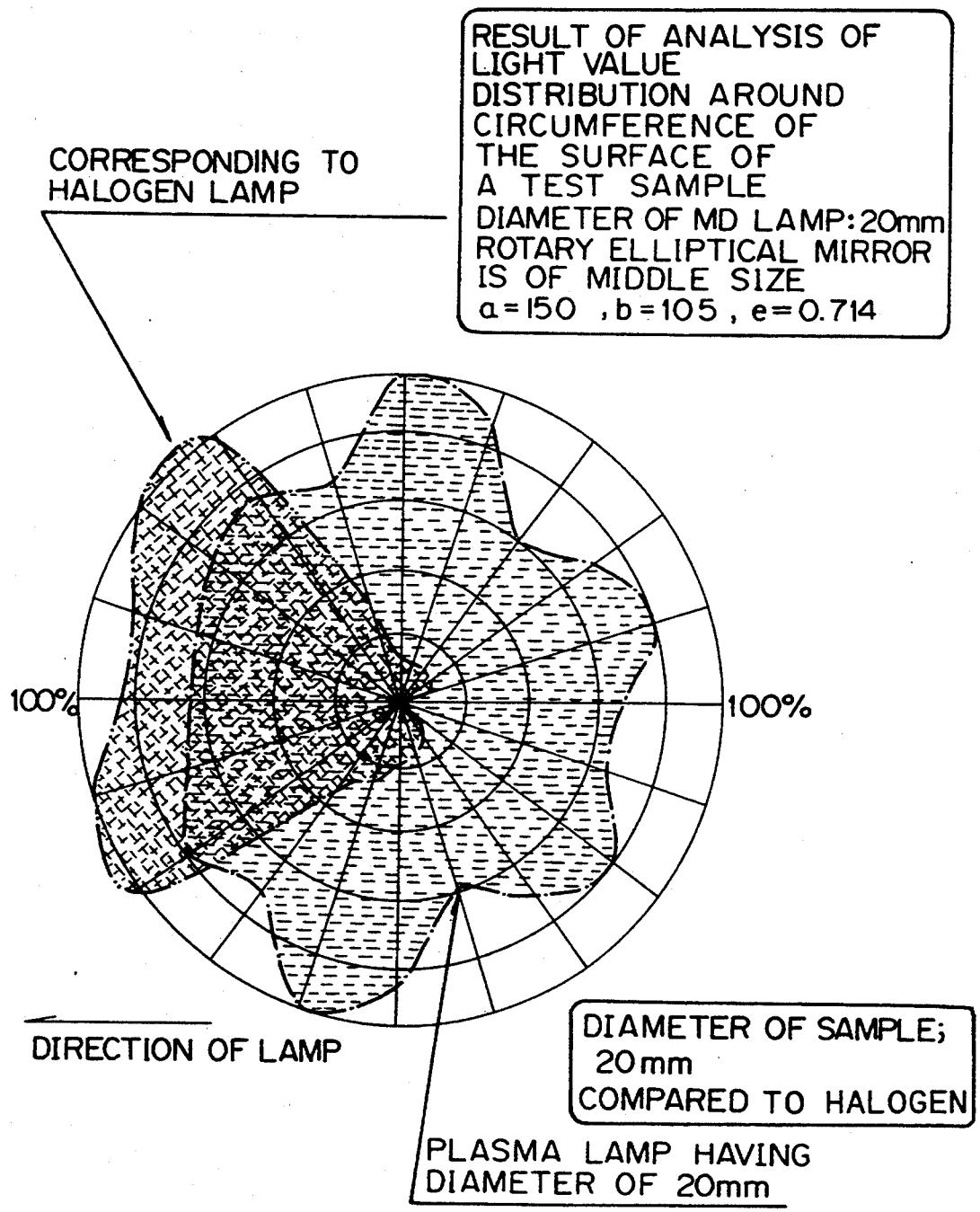
FIG. 17 is a characteristic diagram of temperature distribution over the surface of a test sample, illustrating the result of the heating experiment of the seventh embodiment of the present invention.

In these drawings, numeral 70 is a disc type plasma lamp which encloses such an element as potassium or the like inside the container of a disc-like configuration or a hollow elliptical member made of glass or translucent ceramic material, generates plasma by heating the element and emits the light 9. Numeral 71 designates a rotary fastener adapted to rotate at the end of the rotary elliptical mirror 1 with the support tool 3 fixed thereto and made of an electric wave transmissive material. In these drawings, microwave power having a high frequency of 2 GHz or the like and a few KW is applied to the cavity resonator 5 from the high frequency wave oscillator 7 via the wave guide 6 and the rotary fastener 71. The plasma lamp of a disc type incorporated in the cavity resonator 5 is capable of generating plasma and emitting an intense light having approximately 3 KW power. This light is reflected at the inner surface of the rotary elliptical mirror 1 and condensed at the test sample at the second focal point. The test sample 8 is here heated and melted. When the test sample is pulled upwardly while it is slowly rotated, then crystal growth will proceed. The temperature distribution over the surface of the test sample 8 is uniform across the entire circumference as shown in FIG. 17, so that uniform heating is made possible. Accordingly, it is not necessary to rotate the test sample at a high speed as experienced in a prior art and it may be slowly rotated to form the interface between the solid and the liquid. The sequence is that crystal growth is proceeded at a low enough rotational speed to form a clear laminar flow at the interface.

Figure 18:
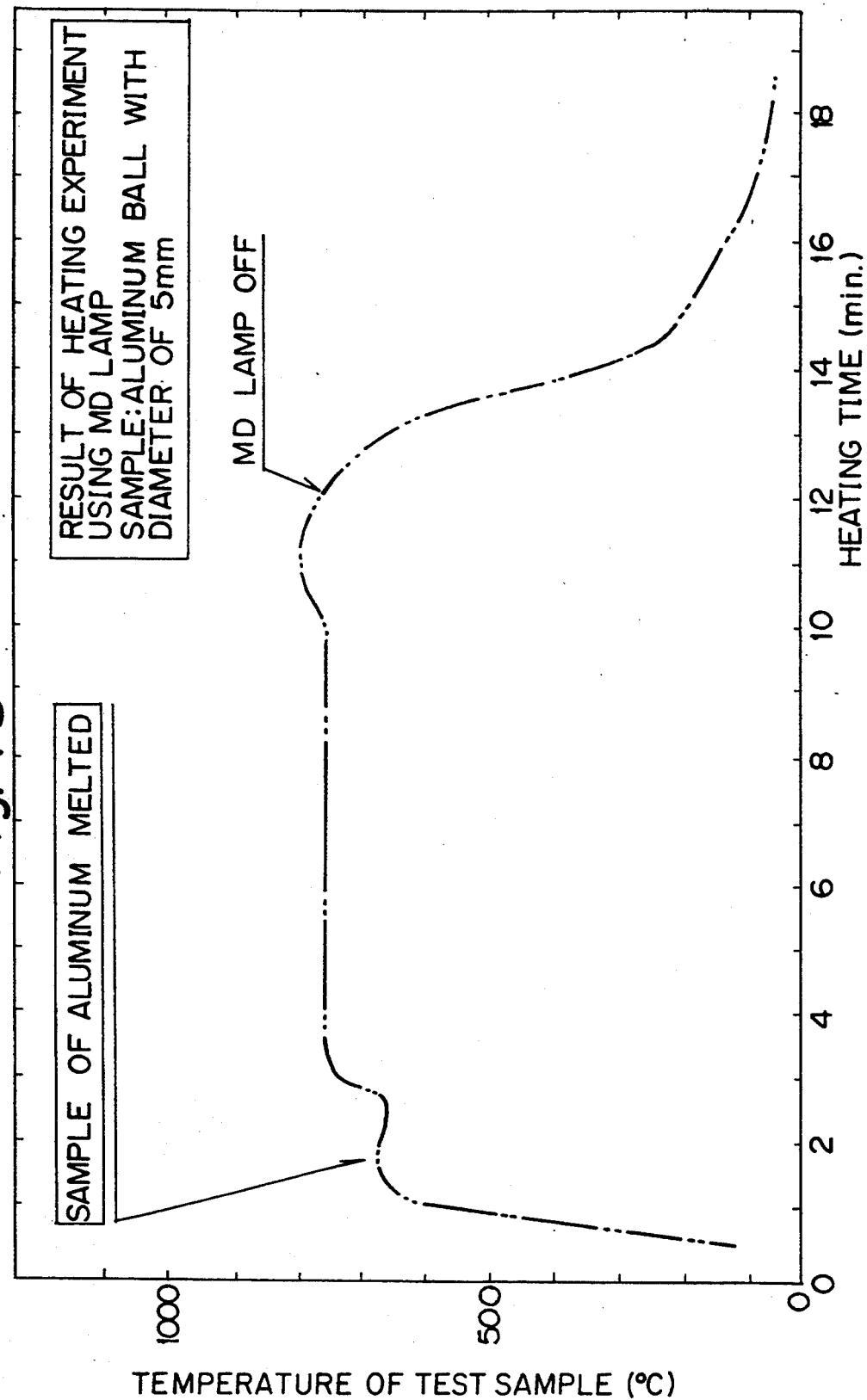
FIG. 18 is a characteristic curve of the heating temperature—the material temperature illustrating the result of the heating experiment of the seventh embodiment of the present invention when aluminum is used as the test sample.

FIG. 18 illustrates the result of the heating test for a test sample (which is in this case aluminum) using a disc-like plasma lamp 70 by means of a single elliptical image heating apparatus. The abscissa indicates the time and the ordinate indicates the temperature. The disc-like plasma lamp which has been employed in the test is adapted to emit light at the wavelength of the near infrared light of 0.76 microns. As is seen from the diagram of FIG. 18, the temperature of the aluminum test sample has reached 660° C. in about 2 minutes and then melted. The input power to the disc type plasma lamp at this time is approximately 300 W.

Figure 19:
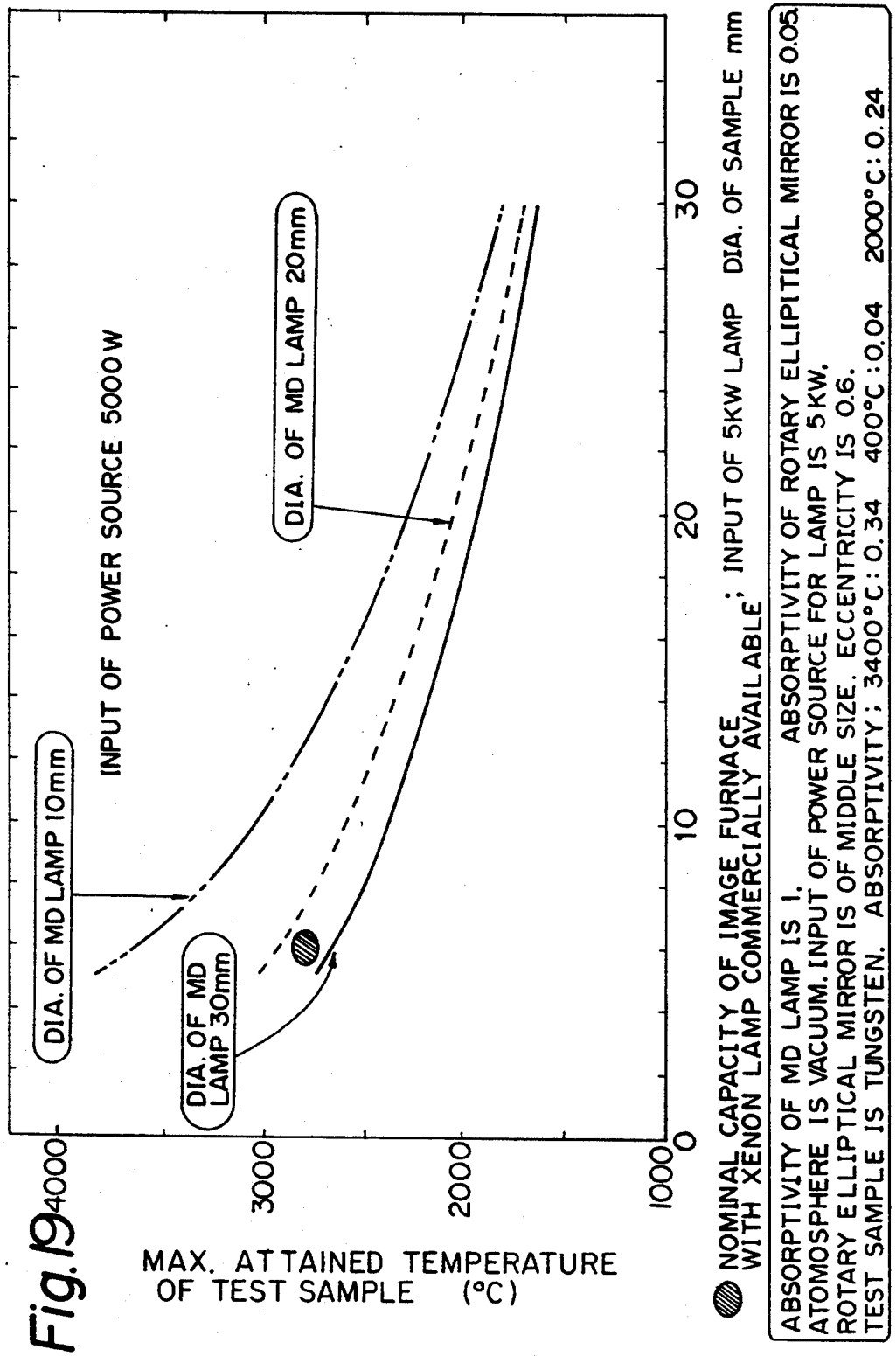
FIG. 19 illustrates the maximum attained temperature experienced in the heating experiment of the seventh embodiment when tungsten is used as the test sample.

FIG. 19 illustrates the maximum temperature attained by the tungsten test sample which is searched by conducting analysis. In this instance, calculation has been made in terms of three kinds of the size of the lamp, or 10, 20, 30 mm. It is thus to be noted that a good heating performance may be expected as compared to the furnace which employs a xenon lamp now commercially available.

Since the emission spectrum of the disc-type plasma lamp 70 can be concentrated at the wavelength providing the highest absorptivity of the test sample 8, a very high heating efficiency may be attained compared to that of a xenon lamp or the like.

Figure 20:
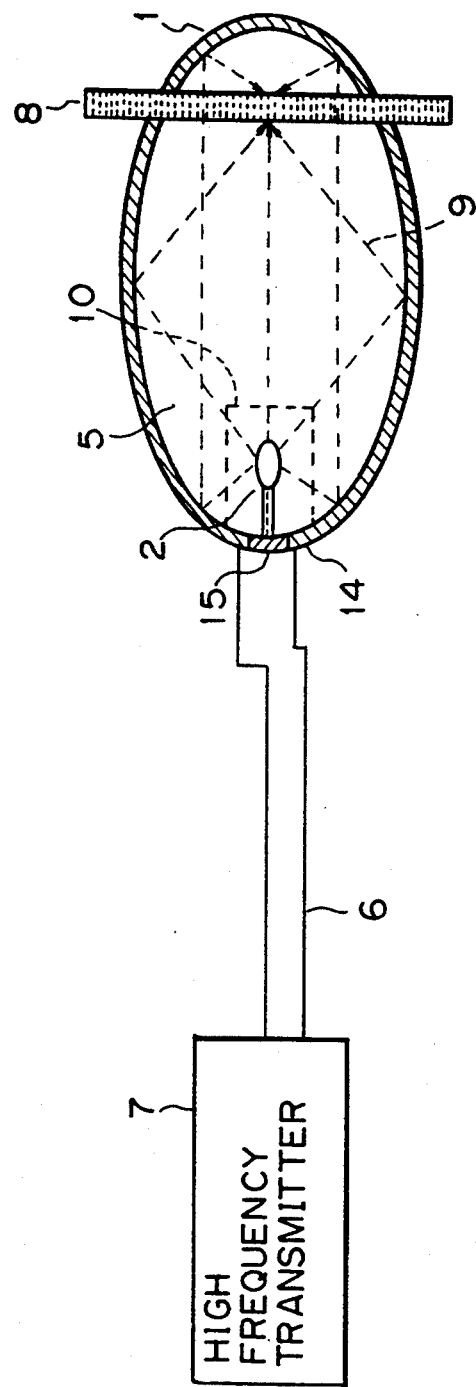
FIGS. 20 and 21 schematically illustrate the constitution of the image heating apparatus of a single elliptical ball microwave discharge type according to the eighth embodiment of the present invention.
Figure 21:
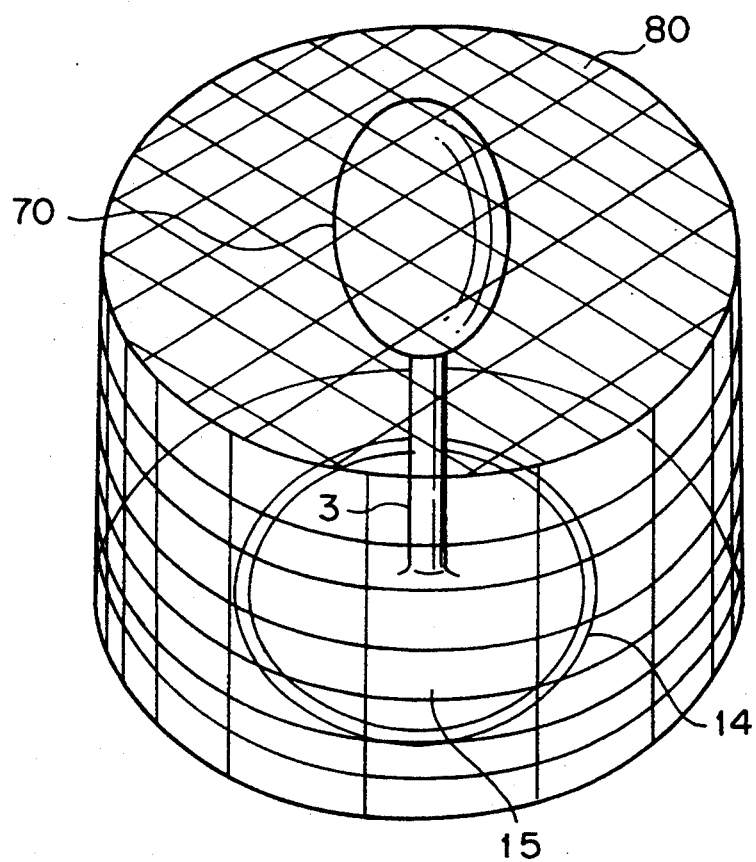

The eighth embodiment of the present invention is illustrated in FIGS. 20 and 21. In these drawings, numeral 80 designates an electric wave shielding container of a cup-like configuration which defines the cavity resonator 5 with the peripheral portion at the open side of the electric wave shielding container of a cup-like configuration being in contact with the rotary elliptical mirror 1 at the first focal point and disposes the disc-like plasma lamp 70 in the cavity resonator. In this embodiment, optimum light emission condition of a lamp may be maintained regardless of the configuration of the rotary elliptical mirror 1.

Figure 22:
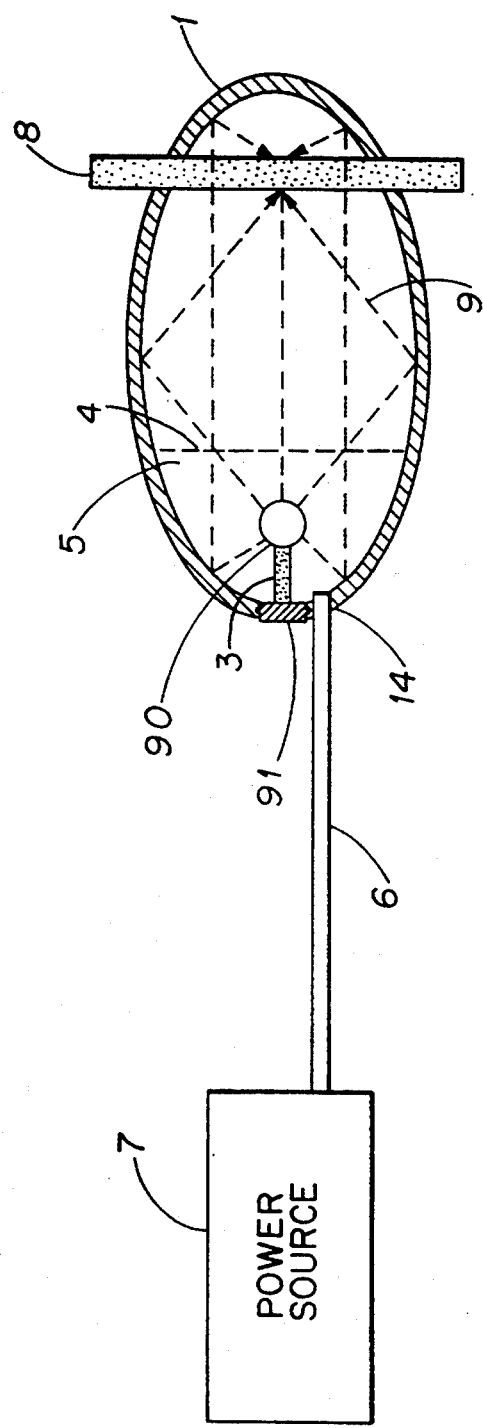
FIGS. 22 and 23 schematically illustrate the constitution of the image heating apparatus using a single elliptical ball microwave discharge particularly utilizing a rotatable cylindrical type microwave discharge plasma lamp according to the ninth embodiment of the present invention.
Figure 23:
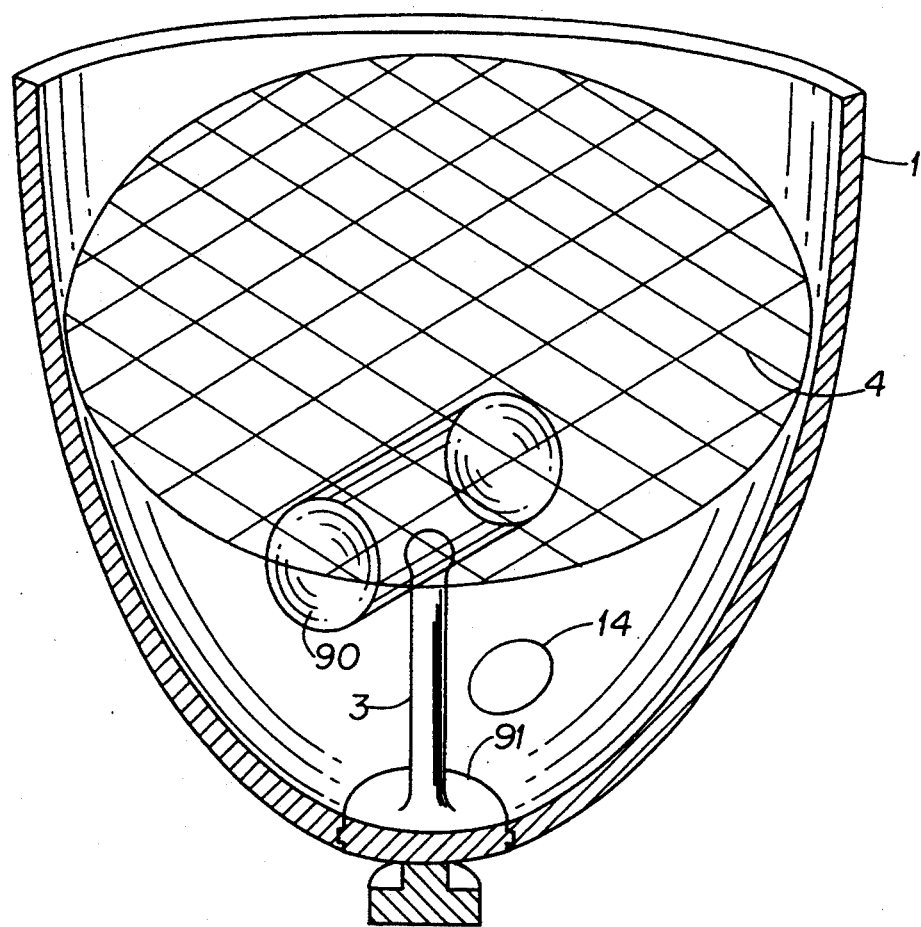

FIGS. 22 and 23 illustrate the ninth embodiment of the present invention. It is to be noted that those components which are the same as those in other embodiments are denoted with same numerals.

In these drawings, numeral 90 is a cylindrical type plasma lamp which encloses an element such as potassium or the like inside the container of a cylinder-like hollow member made of glass or translucent ceramic material. The lamp generates a plasma by means of heating the element which causes the emission of the light 9. Numeral 91 designates a rotary fastener adapted to rotate at the end of the elliptical mirror 1 with the support tool 3 fixed thereto. The fastener is made of an electric wave transmissive material. In these drawings, microwave power having a high frequency of 2 GHz or the like and several KW is applied to the cavity resonator 5 from the high frequency wave oscillator 7 via the waveguide 6 and the window 14. The plasma lamp 90 of a cylindrical type incorporated in the cavity resonator 5 is capable of generating plasma and emitting an intense light. This light is reflected at the inner surface of the elliptical mirror 1 and cylindrically condensed at the test sample at the second focal point. The test sample 8 is here heated and melted. When the test sample is pulled upwardly while it is slowly rotated, crystal growth will proceed.

Figure 24:
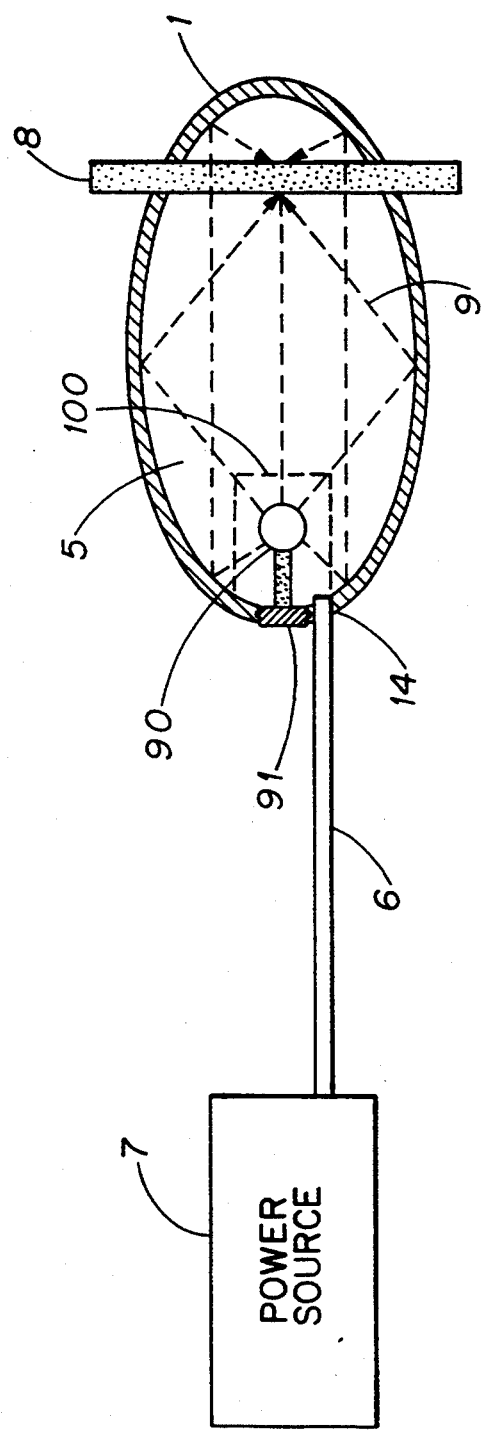
FIGS. 24 and 25 schematically illustrate the constitution of the image heating apparatus using a single elliptical ball microwave discharge particularly utilizing a rotatable cylindrical type microwave discharge plasma lamp in the electric wave shielding plate of a cup-like configuration according to the tenth embodiment of the present invention.
Figure 25:
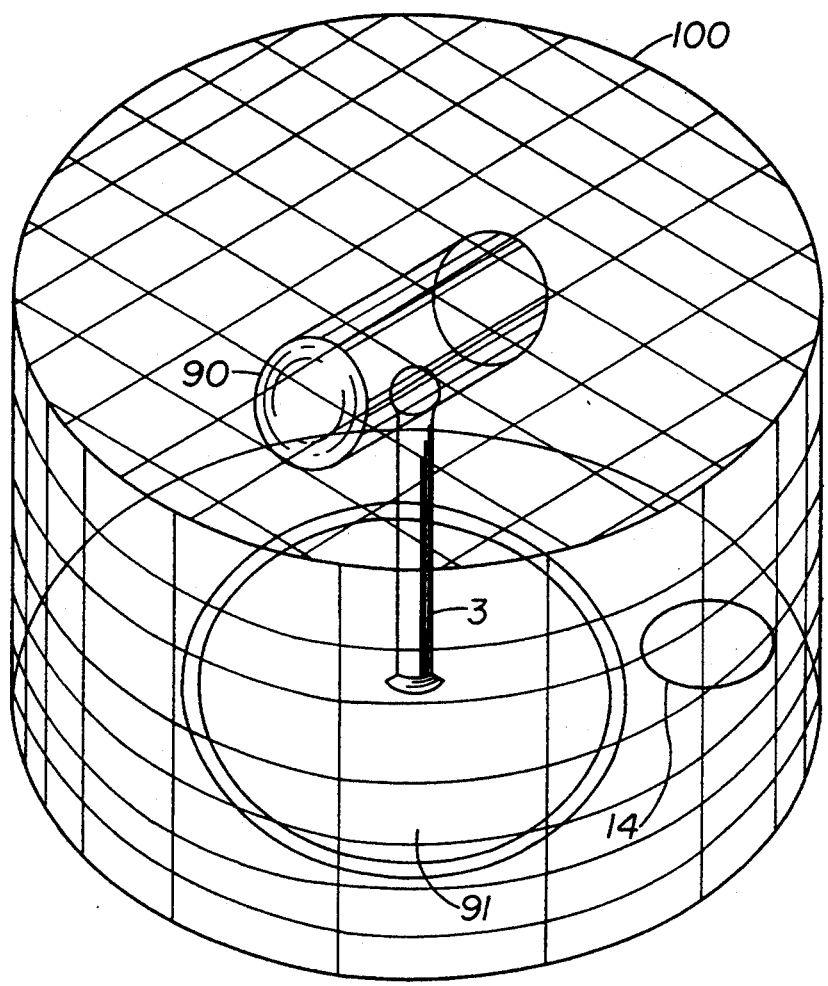

FIGS. 24 and 25 illustrate the tenth embodiment of the present invention. It is to be noted that those components which are the same as those in other embodiments are denoted with the same numerals. In these drawings, numeral 100 designates an electric wave shielding container of a cup-like configuration which defines the cavity resonator 5 with the peripheral portion at the open side of the electric wave shielding container of a cup-like configuration being in contact with the elliptical mirror 1 at the first focal point and the cylindrical type plasma lamp 90 being disposed in the cup-like cavity resonator 4.

Since the emission spectrum of the cylindrical type plasma lamp 90 can be concentrated at the near infrared zone or the ultraviolet zone which provides a wavelength having the greatest absorptivity of the test sample 8, a very high heating efficiency can be attained compared to that of a xenon lamp, halogen lamp or the like. Also, since the wavelength of the light emission can be selectively changed from the ultraviolet zone to the infrared zone by selecting the type of element which fills the microwave discharge lamp, heating can be executed by use of a wavelength having combined optical characteristics of glass, metal, semi-conductor and the like (in other words, various sorts of microwave discharge lamps are provided with different elements such as ultraviolet light being provided by mercury, near infrared light by potassium and so forth).

As explained in connection with the ninth embodiment shown in FIGS. 22 and 23 and the tenth embodiment shown in FIGS. 24 and 25, the cylindrical type microwave discharge lamp 90 can be rotated by the rotary fastener 91, and hence the heated zone of the sample 8 can be reduced.

As explained above, the respective embodiments of the present invention include each one of the rotary elliptical mirror. By employing a second rotary elliptical mirror identical in constitution and so mounted along the longitudinal axis to share the same second focal point, and installing a second plasma lamp at the end of the second rotary elliptical mirror, the entire surface of a test sample may be uniformly irradiated by the light emitted by both plasma lamps.

What is claimed is:

1. An image heating apparatus using a plasma lamp comprising:
    at least one rotary elliptical mirror means having a body defining an interior with a rotary elliptical shape that includes a reflective surface, the body defining a first focal point and a second focal point at the interior;
    plasma lamp means disposed at the first focal point of said rotary elliptical mirror means, the plasma lamp means including a shell having disposed therein an element that generates high temperature plasma in response to an electromagnetic wave concentrated thereat;
    means for supporting said plasma lamp means within the interior at the first focal point;
    a cup-shaped electric wave shielding plate having an open side positioned in the interior of said rotary elliptical mirror means with the open side at the first focal point, said shielding plate being positioned in the interior with the open side at the first focal point so as to define a cavity resonator that reflects an incident electromagnetic wave, said plasma lamp means being positioned within said cavity resonator;
    high frequency oscillator means interconnected with said cavity resonator means to supply an electromagnetic wave to said cavity resonator means via a wave guide; and
    means for locating a test sample at the second focal point of said rotary elliptical mirror means so that high temperature plasma from said plasma lamp means is concentrated at the test sample to cause heating thereof.

2. An image heating apparatus as claimed in claim 1 wherein said electric wave shielding means comprises an electric wave shielding plate so attached that the peripheral edge of the disc thereof is in contact with the inner surface of said rotary elliptical mirror means.

3. An image heating apparatus as claimed in claim 1 wherein said electric wave shielding means comprises an electric wave shielding member of a cup-like configuration and is so attached that the peripheral edge thereof at the open side is in contact with the inner surface of said rotary elliptical mirror means.

4. An image heating apparatus as claimed in claim 1 wherein said electric wave shielding means comprises a spherical member and said wave guide is connected by way of the base of said spherical member.

5. An image heating apparatus as claimed in claim 1 wherein inert gas is filled in the cavity resonator defined by said spherical member.

6. An image heating apparatus as claimed in claim 1 wherein said plasma lamp means is a cylindrical type microwave discharge plasma lamp.

7. An image heating apparatus as claimed in claim 6 wherein said cylindrical type microwave discharge plasma lamp is rotatable at the end of said elliptical mirror.

8. An image heating apparatus as claimed in claim 1 wherein said plasma lamp means is a disc type microwave discharge plasma lamp.

9. An image heating apparatus as claimed in claim 8 wherein said disc type microwave discharge plasma lamp is rotatable at the end of said elliptical mirror.

10. An image heating apparatus as claimed in claim 2 wherein said plasma lamp means comprises a cylindrical type microwave discharge plasma lamp.

11. An image heating apparatus as claimed in claim 10 wherein said plasma lamp means comprises a shell having an element sealed therein, the element generating heating radiation in response to the electromagnetic wave.

12. An image heating apparatus as claimed in claim 11 wherein said electric wave shielding means comprises a grate positioned between each of the first and second focal points and defining a plane substantially transverse to a line defined by the first and second focal points.

13. An image heating apparatus as claimed in claim 12 wherein the waveguide is positioned so that the electromagnetic wave enters said cavity resonator means along a direction aligned with the line defined by the first and second focal points.

14. An image heating apparatus as claimed in claim 12 wherein the means for supporting said plasma lamp means includes means for allowing rotation of the plasma lamp along an axis aligned with the line defined by the first and second focal points, said rotation being relative to the body of said rotary elliptical mirror means.

15. An image heating apparatus as claimed in claim 14 wherein said waveguide is positioned so that the electromagnetic wave enters said cavity resonator means along a line substantially parallel to and non-collinear with the line defined by the first and second focal points.

16. An image heating apparatus as claimed in claim 2 wherein said plasma lamp means comprises a disc type microwave discharge plasma lamp.

17. An image heating apparatus as claimed in claim 16 wherein said plasma lamp means comprises a shell having an element sealed therein, the element generating heating radiation in response to the electromagnetic wave.

18. An image heating apparatus as claimed in claim 17 wherein said electric wave shielding means comprises a grate positioned between each of the first and second focal points and defining a plane substantially transverse to a line defined by the first and second focal points.

19. An image heating apparatus as claimed in claim 18 wherein the waveguide is positioned so that the electromagnetic wave enters said cavity resonator means along a direction aligned with the line defined by the first and second focal points.

20. An image heating apparatus as claimed in claim 18 wherein the means for supporting said plasma lamp means includes means for allowing rotation of the plasma lamp along an axis aligned with the line defined by the first and second focal points, said rotation being relative to the body of the rotary elliptical mirror means.

21. An image heating apparatus as claimed in claim 20 wherein said waveguide is positioned so that the electromagnetic wave enters said cavity resonator means along a line parallel to and non-collinear with the line defined by the first and second focal points.

22. An image heating apparatus as claimed in claim 3 wherein said plasma lamp means comprises a cylindrical type microwave discharge plasma lamp.

23. An image heating apparatus as claimed in claim 22 wherein said plasma lamp means comprises a shell having an element sealed therein, the element generating heating radiation in response to the electromagnetic wave.

24. An image heating apparatus as claimed in claim 23 wherein said electric wave shielding means comprises a grate positioned between each of the first and second focal points and defining a plane substantially transverse to a line defined by the first and second focal points.

25. An image heating apparatus as claimed in claim 24 wherein the waveguide is positioned so that the electromagnetic wave enters said cavity resonator means along a direction aligned with the line defined by the first and second focal points.

26. An image heating apparatus as claimed in claim 24 wherein the means for supporting said plasma lamp means includes means for allowing rotation of the plasma lamp along an axis aligned within the line defined by the first and second focal points, said rotation being relative to the body of the rotary elliptical mirror means.

27. An image heating apparatus as claimed in claim 26 wherein said waveguide is positioned so that the electromagnetic wave enters said cavity resonator means along a line parallel to and non-collinear with the line defined by the first and second focal points.

28. An image heating apparatus as claimed in claim 3 wherein said plasma lamp means comprises a disc type microwave discharge plasma lamp.

29. An image heating apparatus as claimed in claim 28 wherein said plasma lamp means comprises a shell having an element sealed therein, the element generating heating radiation in response to the electromagnetic wave.

30. An image heating apparatus as claimed in claim 29 wherein said electric wave shielding means comprises a grate positioned between each of the first and second focal points and defining a plane substantially transverse to a line defined by the first and second focal points.

31. An image heating apparatus as claimed in claim 30 wherein the waveguide is positioned so that the electromagnetic wave enters said cavity resonator means along a direction aligned with the line defined by the first and second focal points.

32. An image heating apparatus as claimed in claim 30 wherein the means for supporting said plasma lamp means includes means for allowing rotation of the plasma lamp along an axis aligned within the line defined by the first and second focal points, said rotation being relative to the body of the rotary elliptical mirror means.

33. An image heating apparatus as claimed in claim 32 wherein said waveguide is positioned so that the electromagnetic wave enters said cavity resonator means along a line parallel to and non-collinear with the line defined by the first and second focal points.

34. An image heating apparatus as claimed in claim 2 wherein said plasma lamp means comprises a spherical type plasma lamp.

35. An image heating apparatus as claimed in claim 34 wherein said plasma lamp means comprises a shell having an element sealed therein, the element generating heating radiation in response to the electromagnetic wave.

36. An image heating apparatus as claimed in claim 35 wherein said electric wave shielding means comprises a grate positioned between each of the first and second focal points and defining a plane substantially transverse to a line defined by the first and second focal points.

37. An image wave heating apparatus as claimed in claim 36 wherein the waveguide is positioned so that the electromagnetic wave enters said cavity resonator means along a direction aligned with the line defined by the first and second focal points.

38. An image heating apparatus as claimed in claim 36 wherein the means for supporting said plasma lamp means includes means for allowing rotation of the plasma lamp along an axis aligned within the line defined by the first and second focal points, said rotation being relative to the body of the rotary elliptical mirror means.

39. An image heating apparatus as claimed in claim 38 wherein said waveguide is positioned so that the electromagnetic wave enters said cavity resonator means along a line parallel to and non-collinear with the line defined by the first and second focal points.

40. An image heating apparatus as claimed in claim 3 wherein said microwave discharge plasma lamp comprises a spherical type plasma lamp.

41. An image heating apparatus as claimed in claim 40 wherein said plasma lamp means comprises a shell having an element sealed therein, the element generating heating radiation in response to the electromagnetic wave.

42. An image heating apparatus as claimed in claim 41 wherein said electric wave shielding means comprises a grate positioned between each of the first and second focal points and defining a plane substantially transverse to a line defined by the first and second focal points.

43. An image wave heating apparatus as claimed in claim 42 wherein the waveguide is positioned so that the electromagnetic wave enters said cavity resonator means along a direction aligned with the line defined by the first and second focal points.

44. An image wave heating apparatus as claimed in claim 42 wherein the means for supporting said plasma lamp means includes means for allowing rotation of the plasma lamp along an axis aligned within the line defined by the first and second focal points, said rotation being relative to the body of the rotary elliptical mirror means.

45. An image wave heating apparatus as claimed in claim 44 wherein said waveguide is positioned so that the electromagnetic wave enters said cavity resonator means along a line parallel to and non-collinear with the line defined by the first and second focal points.

46. An image heating apparatus as claimed in claim 7 wherein said waveguide is positioned so that the electromagnetic wave enters said cavity resonator means along a line that is parallel to and non-collinear with the line defined by said first and second focal points.

47. An image heating apparatus as claimed in claim 9 wherein said waveguide is positioned so that the electromagnetic wave enters said cavity resonator means along a line that is parallel to and non-collinear with the line defined by said first and second focal points.

48. An image heating apparatus as claimed in claim 1 wherein the plasma lamp means comprises a hollow elliptical shell having an element that transmits plasma in response to the electromagnetic wave therein.

49. An image heating apparatus as claimed in claim 48 wherein the shielding means comprises a cup like grate that surrounds the plasma lamp means.

50. An image,heating-apparatus as claimed in claim 48 wherein the shielding means comprises a grate defining a plane transverse to a line defined by the first end of the second focal points and positioned within the interior of the body of the rotary elliptical mirror means at a point between the first and the second focal points.

51. An image heating apparatus as claimed in claims 48 wherein the means for supporting includes means for rotating the plasma lamp about an axis aligned substantially with a line defined by the first and second focal points, the rotation being relative to the body of the rotary elliptical mirror.

52. An image heating apparatus as claimed in claim 1 wherein the plasma lamp means comprises a substantially spherical shell of substantially translucent material having the element disposed therein.

53. An image heating apparatus as claimed in claim 52 wherein the shielding means comprises a second translucent spherical member positioned over the spherical shell, the second spherical member including a translucent material having disposed thereon a grate for reflecting the electromagnetic wave while allowing a plasma generated light to pass therethrough.

54. An image heating apparatus as claimed in claim 53 wherein the spherical member includes a base extending from the spherical member along the direction collinear with and opposite to a direction of extension of the shell and means for supporting, the base including a grate positioned thereover for shielding the electromagnetic wave.

55. An image heating apparatus as claimed in claim 54 wherein the base is interconnected with the waveguide and the electromagnetic wave passes therethrough.

56. An image heating apparatus as claimed in claim 55 wherein each of the base, the shell and the means for supporting are substantially aligned along a line defined by each of the first and second focal points.

57. An image heating apparatus as claimed in claim 56 further comprising an inert gas sealed within the spherical member.

58. An image heating apparatus as claimed in claim 57 further comprising an enclosure plate positioned substantially remote from the means for supporting on the base for sealing the spherical member.

59. An image heating apparatus as claimed in claim 58 wherein the sealing plate comprises a material that allows the electromagnetic wave to pass therethrough from the waveguide.

60. An image heating apparatus as claimed in claim 1 wherein each of the plasma lamp means, the means for supporting and the waveguide are substantially collinear with a line defined by each of the first and second focal points.

61. An image heating apparatus as claimed in claim 2 wherein each of the plasma lamp means, the means for supporting and the waveguide are substantially collinear with a line defined by each of the first and second focal points.

62. An image heating apparatus as claimed in claim 3 wherein each of the plasma lamp means, the means for supporting and the waveguide are substantially collinear with a line defined by each of the first and second focal points.

63. An image heating apparatus as claimed in claim 8 wherein each of the plasma lamp means, the means for supporting and the waveguide are substantially collinear with a line defined by each of the first and second focal points.

64. An image heating apparatus as claimed in claim 9 wherein each of the plasma lamp means, the means for supporting and the waveguide are substantially collinear with a line defined by each of the first and second focal points.

65. An image heating apparatus as claimed in claim 53 wherein the spherical member includes an inert gas sealed therein.

66. An image heating apparatus as claimed in claim 1 wherein the shielding plate substantially surrounds the plasma lamp means.

* * * * *